(12) United States Patent
Bhattacharya et al.

(10) Patent No.: US 7,251,574 B1
(45) Date of Patent: Jul. 31, 2007

(54) MEASURING BIT ERROR RATE OF RADIO FREQUENCY TRANSCEIVERS

(75) Inventors: Soumendu Bhattacharya, Atlanta, GA (US); Rajarajan Senguttuvan, Atlanta, GA (US); Abhijit Chatterjee, Atlanta, GA (US)

(73) Assignee: Georgia Institute of Technology, Atlanta, GA (US)

( * ) Notice: Subject to any disclaimer, the term of this patent is extended or adjusted under 35 U.S.C. 154(b) by 0 days.

(21) Appl. No.: 11/389,635

(22) Filed: Mar. 24, 2006

(51) Int. Cl.
*G01R 25/00* (2006.01)

(52) U.S. Cl. .............................. 702/79; 702/85; 702/90; 398/158; 398/192

(58) Field of Classification Search .................. 702/79, 702/90, 85; 370/485, 342, 479, 350, 508, 370/528; 398/5, 158, 192
See application file for complete search history.

(56) References Cited

U.S. PATENT DOCUMENTS 5,974,584 A * 10/1999 Hendrickson et al. ...... 714/800
6,580,531 B1 * 6/2003 Swanson et al. ............ 398/5

OTHER PUBLICATIONS

Soumendu Bhattacharya et al., "Production Test Technique for Measuring BER of Ultra-Wideband (UWB) Devices," IEEE Transactions on Microwave Theory and Techniques, Nov. 2005, pp. 1-8.

* cited by examiner

*Primary Examiner*—John Barlow
*Assistant Examiner*—Hien Vo
(74) *Attorney, Agent, or Firm*—Merchant & Gould

(57) ABSTRACT

A bit error rate test on a transceiver is accelerated by adding a phase offset to data phase encoding and decoding in the transceiver and by mapping bit error rate test results from an elevated error rate condition to a normal error rate condition for the transceiver. The elevated error rate is accomplished by adjusting the phase of the phase encoder and decoder with the value of the phase offset so that the encoded data transmission signal is not as robust against noise as it normally would be. Noise in the form of an interference signal is introduced during the transmission, and the bit error rate is measured after the receiver has decoded the signal. The bit error rate (BER) data with an elevated propensity for error is mapped against bit error rate data for normal operations. A mapping function is built to map $BER_E$ (bit error rate elevated) data—data from the elevated error rate condition for data encoding, to $BER_N$ (normal bit error rate) data—data from the normal error rate condition for data encoding. The $BER_E$ data is mapped to $BER_N$ data using the mapping function so that the BER performance of the transceiver may be measured using far fewer test sequences of digital bits.

20 Claims, 9 Drawing Sheets

US 7,251,574 B1

MEASURING BIT ERROR RATE OF RADIO FREQUENCY TRANSCEIVERS

FIELD OF THE INVENTION

This invention relates to testing radio frequency (RF) transceivers to measure their bit error rate (BER). More particularly, the invention relates to a system and method for bit error rate testing of transceivers that use phase encoders to encode data for transmission.

BACKGROUND OF THE INVENTION

In wireless short-range high-data-rate communication, ultra-wideband communications has emerged as the standard of choice. Further, orthogonal frequency division multiplex mode (OFDM) has been applied to the frequency range to divide it into multiple bands. Hence, this ultra wide-band technique has been given the name multiband OFDM or MB-OFDM.

When production tests are performed on ultra-wideband (UWB) tranceivers, the test specification includes bit error rate (BER), sensitivity, "in-band" interference and synchronization. Among these tests for UWB transceivers, the BER test and its tolerance to "in-band"/adjacent channel interference is a critical specification to be met during manufacturing test. In effect, this test is a measure of the quality of the data transmission performance of the transceiver.

Manufacturing test cost of transceivers has become a significant portion of the total manufacturing cost for present-day wireless products. The test cost may amount to as much as 40% of the overall production cost. This is due to the cost of sophisticated test equipment required and the extended length of time needed to perform a BER test on a transceiver. Accordingly, there is a need for a test technique that reduces test time, and there is a need for a less complex and thus less expensive test system.

SUMMARY OF THE INVENTION

In accordance with this invention, the above problems and other problems have been solved by adding a phase offset to data phase encoding and decoding in a transceiver and by mapping the bit error rate test results from an elevated error rate condition to a normal error rate condition for the transceiver. The elevated error rate is accomplished by adjusting the phase of the phase encoder and decoder with a phase offset so that the encoded data transmission signal is not as robust against noise as it normally would be. Noise in the form of an interference signal is introduced during the transmission, and the bit error rate is measured after the receiver has decoded the signal. The bit error rate (BER) data with an elevated propensity for error is mapped against bit error rate data for normal operations. A mapping function is built to map $BER_E$ (bit error rate elevated) data—data from the elevated error rate condition for data encoding—to $BER_N$ (bit error rate normal) data—data from the normal error rate condition for data encoding. The $BER_E$ data is mapped to $BER_N$ data using the mapping function so that the bit error rate performance of the transceiver may be measured using far fewer test digital bits in the test sequence.

The invention may be implemented as a computer process, a computing system or as an article of manufacture such as a computer program product. The computer program product may be a computer storage media readable by a computer system and encoding a computer program of instructions for executing a computer process. The computer program product may also be a propagated signal on a carrier readable by a computing system and encoding a computer program of instructions for executing a computer process.

The advantages of the invention are several fold. A simple testing system of digital signal processors and software may be used to reduce the cost of the test system. Also, the amount of transmitted data to produce an acceptable quantity of data for a bit error rate test, and the time to make the test may be reduced by a factor of 100 or more. For example, if a normal bit error rate test requires 50,000,000 bits and 300 seconds of test time per transceiver, then a bit error rate test using the present invention can be accomplished with less than 500,000 bits and 3 seconds of test time.

These and various other features as well as advantages, which characterize the present invention, will be apparent from a reading of the following detailed description and a review of the associated drawings.

DETAILED DESCRIPTION

In one preferred embodiment of the invention, the phase encoding of the digital data by a transceiver is performed with quadrature phase shift keying (QPSK) modulation. QPSK is the modulation used in MB-OFDM (multi-band orthogonal frequency division multiplexing). In one exemplary embodiment, QPSK modulation phase encodes data bits into phase-encoded data signals at frequencies from 4.25 MHz to 528 MHz with 4.25 MHz separation. For RF transmission these phase-encoded, data signals are mixed with base bands from 3.1 GHz to 10.6 GHz with 528 MHz separation. A further description of the principles of operation of this exemplary embodiment is in an article entitled "Production Test Technique for Measuring BER of Ultra-Wide (UWB) Devices" by Bhattacharya, Senguttuvan and Chatterjee, IEEE Transactions on MTT-IMS 2005 Special Issue, November, 2005, which is incorporated herein by reference.

Figure 1:
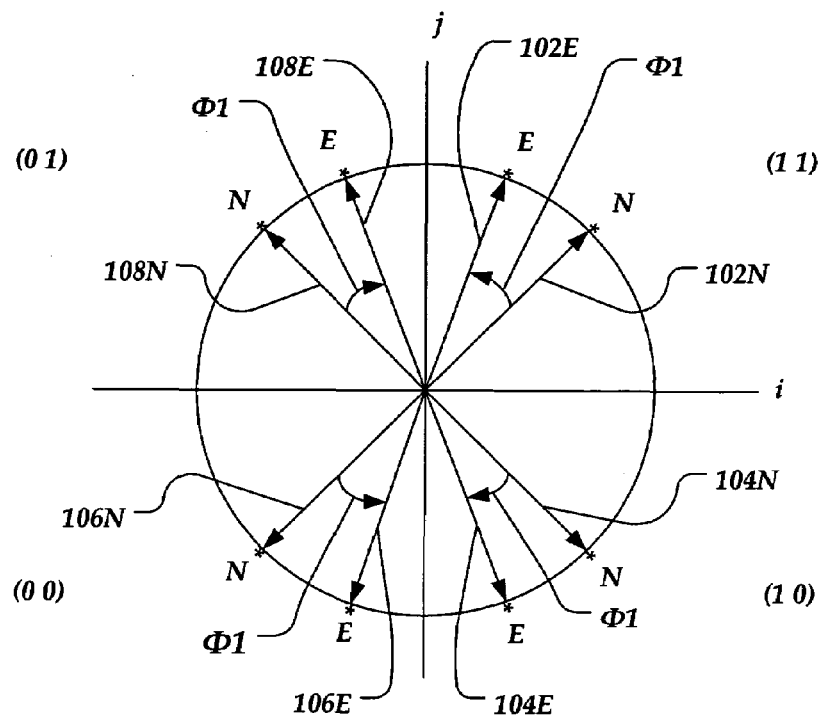
FIG. 1 is a complex plane diagram of QPSK (Quadrature Phase Shift Keying) symbols representing a pair a data bits encoded by QPSK modulation and the same QPSK symbols shifted by a phase offset to a new position for accelerated, bit error rate testing.
Figure 2:
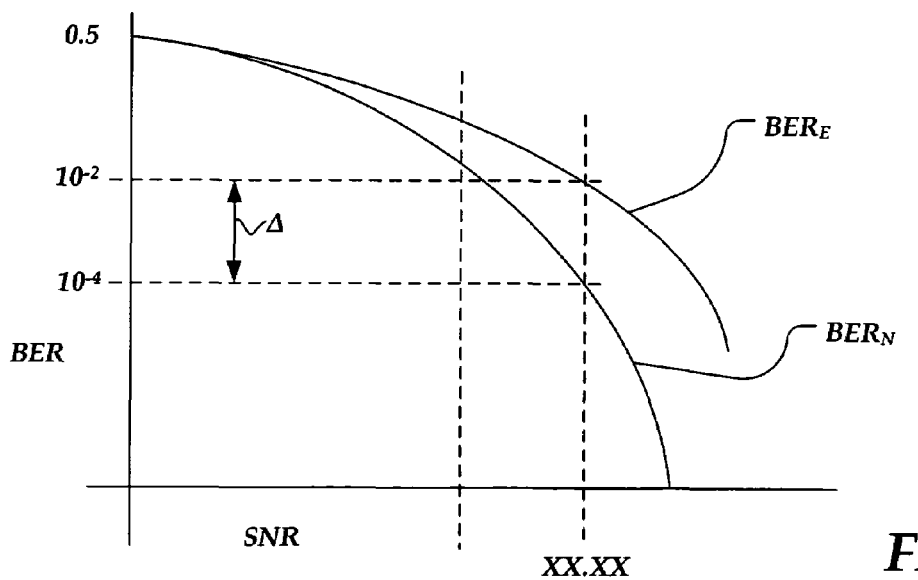
FIG. 2 is a graph showing normal bit error rate ($BER_N$) as a function of signal to noise ratio (SNR) and elevated bit error rate ($BER_E$) as a function of signal to noise ratio (SNR).

The principles behind the operations of the embodiments of the invention are best understood by an examination of FIGS. 1 and 2. Throughout this detailed description, reference is made back to elements in FIG. 1 and FIG. 2 using the reference names and numerals used in those figures.

FIG. 1 is a complex-plane diagram of QPSK symbols, i.e. phase encoded data signals representing data bit pairs. The QPSK phase encoded data signals at positions marked "N" represent a pair of data bits encoded by Quadrature Phase Shift Keying (QPSK) modulation in normal operative position sin each quadrant of the complex plane in FIG. 1. The same phase encoded data signals at positions marked "E" and shifted by a phase offset to elevated-error-rate positions in each quadrant for accelerated bit error rate testing of the transceiver.

In the QPSK modulation or encoding technique, a string of data bits is first parsed into a string of pairs of data bits. Each pair of bits is represented by a QPSK phase encoded data signal in one quadrant of the complex plane in FIG. 1. In FIG. 1, the i-axis is the axis for real units, and the j-axis is the axis for imaginary units. The QPSK modulation or encoding of the data bit pairs is performed according to the following QPSK Modulation Table. For ease of reference, a phase encoded data signal is hereinafter referred to as a PHASER.

QPSK Modulation Table

| Input Bit Pair (D0, D1) | i-axis (I) | j-axis (Q) |
|---|---|---|
| 0 0 | −1 | −1 |
| 0 1 | −1 | 1 |
| 1 0 | 1 | −1 |
| 1 1 | 1 | 1 |

Where d is a PHASER, and $d = (I + jQ) \times (1/\sqrt{2})$.

As shown in FIG. 1, the upper right quadrant encodes the data bit pair "1 1", and the i-axis value and j-axis value (Q) for the corresponding PHASER 102N are 1 and 1 respectively. The lower right quadrant encodes the data bit pair "1 0", and the i-axis and j-axis values for the corresponding PHASER 104N are 1 and −1 respectively. The lower left quadrant encodes the data bit pair "0 0", and the i-axis and j-axis values for the corresponding PHASER 106N are −1 and −1 respectively. The upper left quadrant encodes the data bit pair "0 1", and the I-axis and j-axis values for the corresponding PHASER 108N are −1 and 1 respectively.

The PHASERs 102N, 104N, 106N and 108N are shown in the 'normal' operative positions in the quadrants and are accordingly marked "N". These "N" positions as depicted in FIG. 1 are at 45°, 135°, 225° and 315° starting from the upper j-axis and rotating clockwise. In an "N" position, a PHASER is rotationally in the middle of each quadrant which makes the PHASER the most resistant to noise. In other words, the noise would have to rotate a PHASER by 45° to cause the PHASER to enter another quadrant and therefore be decoded in error. For example, if PHASER 102N is shifted by noise counterclockwise by more than 45°, vector 102N will be in the 0 1 quadrant and it will decoded in error as 0 1 rather than 1 1.

The number of errors may be elevated during transceiver testing by adding phase offset Φ1 in the QPSK modulation or encoding process. As shown in FIG. 1, if phase offset Φ1 is added to the PHASERs 102N, 104N, 106N and 108N, the PHASERs are shifted to the "E" positions, much closer to the j-axis. In these E positions the PHASERs 102E, 104E, 106E and 108E are much more susceptible to noise and hence the number of errors is elevated. When the bit error rate is elevated, the time to perform a bit error rate test on the transceiver for the same amount of errors is reduced, and the BER test is accelerated.

FIG. 2 is a graph showing normal bit error rate ($BER_N$) as a function of signal to noise ratio (SNR) and elevated bit error rate ($BER_E$) as a function of signal to noise ratio (SNR). Line or curve $BER_N$ in the graph indicates how the bit error rate varies with SNR when the PHASERs are coded in the "N" positions (FIG. 1), i.e. with no phase offset. Line or curve $BER_E$ in the graph indicates how the bit error rate varies with SNR when the PHASERs are coded in the "E" positions (FIG. 1), i.e. with phase offset Φ1.

Importantly, the BER curves in FIG. 2 are monotonic. As a result, a BER value on one curve may be used to predict the BER value on the other curve. In other words, once a mapping function is built to map or estimate the values from one BER curve to the other BER curve, the BER values can be measured for one condition, and the BER values can be computed for the other condition. For example, if measurements are made to create the $BER_N$ curve and the $BER_E$ curve, a map function can be built to map values from a $BER_E$ curve to a $BER_N$ curve. Thereafter, transceivers can be tested at the elevated $BER_E$ curve values, and their normal $BER_N$ values will also be known.

Being able to map from a $BER_E$ value to a $BER_N$ value is also important because fewer test sequences of data bits may be run to satisfy the BER test specification for the transceiver. In FIG. 2, the graph shows that for a SNR of value XX.XX, there is an elevated error rate "Δ" of 100 in the bit error rate between the elevated condition, i.e. $BER_E$ value, and the normal condition, i.e. $BER_N$ value. Accordingly, since the test specification requires a certain number of errors, the specification can be measured faster by testing the transceiver in the elevated condition.

In the example of FIG. 2, the test will be shortened by an acceleration factor varying about 100. The acceleration factor equals the elevated error rate Δ. As the SNR value varies from XX.XX, the elevated error rate Δ between the $BER_E$ curve and the $BER_N$ curve will vary. In the example of FIG. 2, the elevated error rate Δ and thus the acceleration factor will be less than 100 for SNR values lower than XX.XX and will be greater than 100 for SNR values higher than XX.XX.

Figure 3:
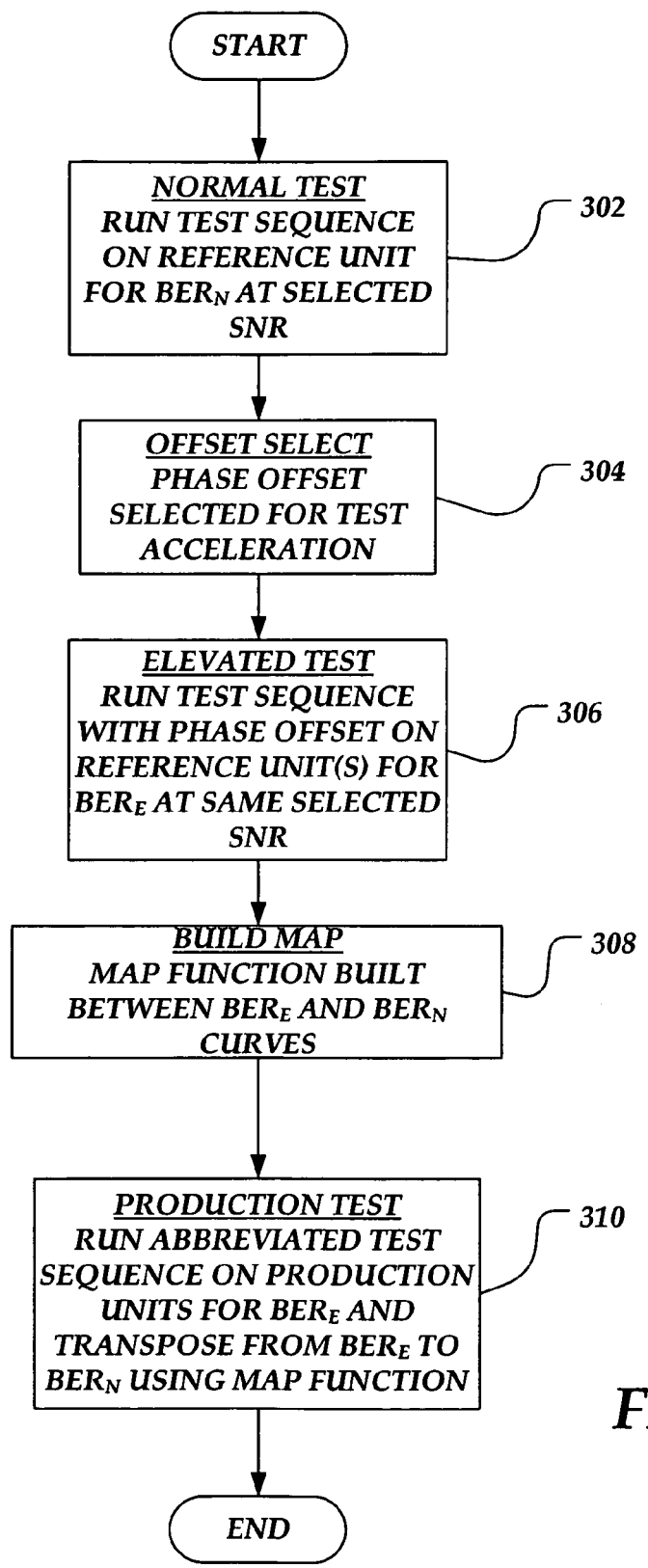
FIG. 3 shows one embodiment of a system or method for testing a transceiver for bit error rate in accordance with invention.

FIG. 3 shows operations of a system or method for testing a transceiver for bit error rate in accordance with one embodiment of the invention. The logical operations of the various embodiments of the present invention are implemented (1) as a sequence of computer implemented acts or program modules running on a computing system, such as digital signal processors, and/or (2) as interconnected machine logic circuits or circuit modules within the computing system. The implementation is a matter of choice dependent on the performance requirements of the computing system implementing the invention. Accordingly, the logical operations making up the embodiments of the present invention described herein may be referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

In FIG. 3 the operation flow begins at normal test module 302. Normal test module 302 runs a full test sequence of data bits on a reference transceiver operating at normal QPSK modulation. The full test sequence is run at each of a plurality of selected signal to noise ratios. The signal to noise ratio is changed by adjusting the strength of an interference signal used during the test. There is no phase offset Φ1 in the QPSK modulation, and the PHASERs 102N, 104N, 106N and 108N are at the "N" (normal) positions. This full test will yield data for the $BER_N$ curve in FIG. 2.

Offset select module 304 selects the phase offset Φ1 used to elevate the bit error rate and thereby accelerate the bit error rate test. Operations to perform the phase offset selection are described hereinafter with reference to FIG. 7.

Elevated test module 306 runs an abbreviated test sequence of data bits on the reference transceiver operating with phase offset Φ1 added into the QPSK modulation. The abbreviated test sequence is run at each of the same selected signal to noise ratios used in the normal test. The PHASERs 102E, 104E, 106E and 108E are at the "E" (elevated) positions. This test run will yield data for the $BER_E$ curve in FIG. 2.

Build map module 308 compares the data in the $BER_E$ curve to the data in the $BER_N$ curve and builds a mapping function to map values from the $BER_E$ curve to the $BER_N$ curve. The mapping function may be implemented as a look-up table or as a mathematical expression. For example, since the $BER_N$ curve and $BER_E$ curve can be approximated by a polynomial expression, a polynomial expression could be used for the map function as well. In a look-up table implementation, BER values at selected SNR values would be in the table, and BER values between selected SNR values would be extrapolated from adjacent BER values in the table.

In another embodiment of the invention, the elevated test module and the build map-function are run on more than one transceiver reference unit. In effect the elevated test module and the build map-function operations are performed on a plurality of transceiver training units to produce an aggregate map-function based on the $BER_E$ curve for all the training units.

Production test module 310 runs an abbreviated test sequence of data bits on each transceiver production unit. The production test module uses the phase offset Φ1 selected by offset select module 304 to yield the $BER_E$ data for each transceiver production unit, i.e. the transceiver under test. The $BER_E$ values for the transceiver under test are then mapped to $BER_N$ values using the mapping function from build map module 308. The $BER_N$ values are compared against the BER (bit ERROR RATE) test specification for the transceiver under test to evaluate the BER performance of the transceiver under test.

Figure 4:
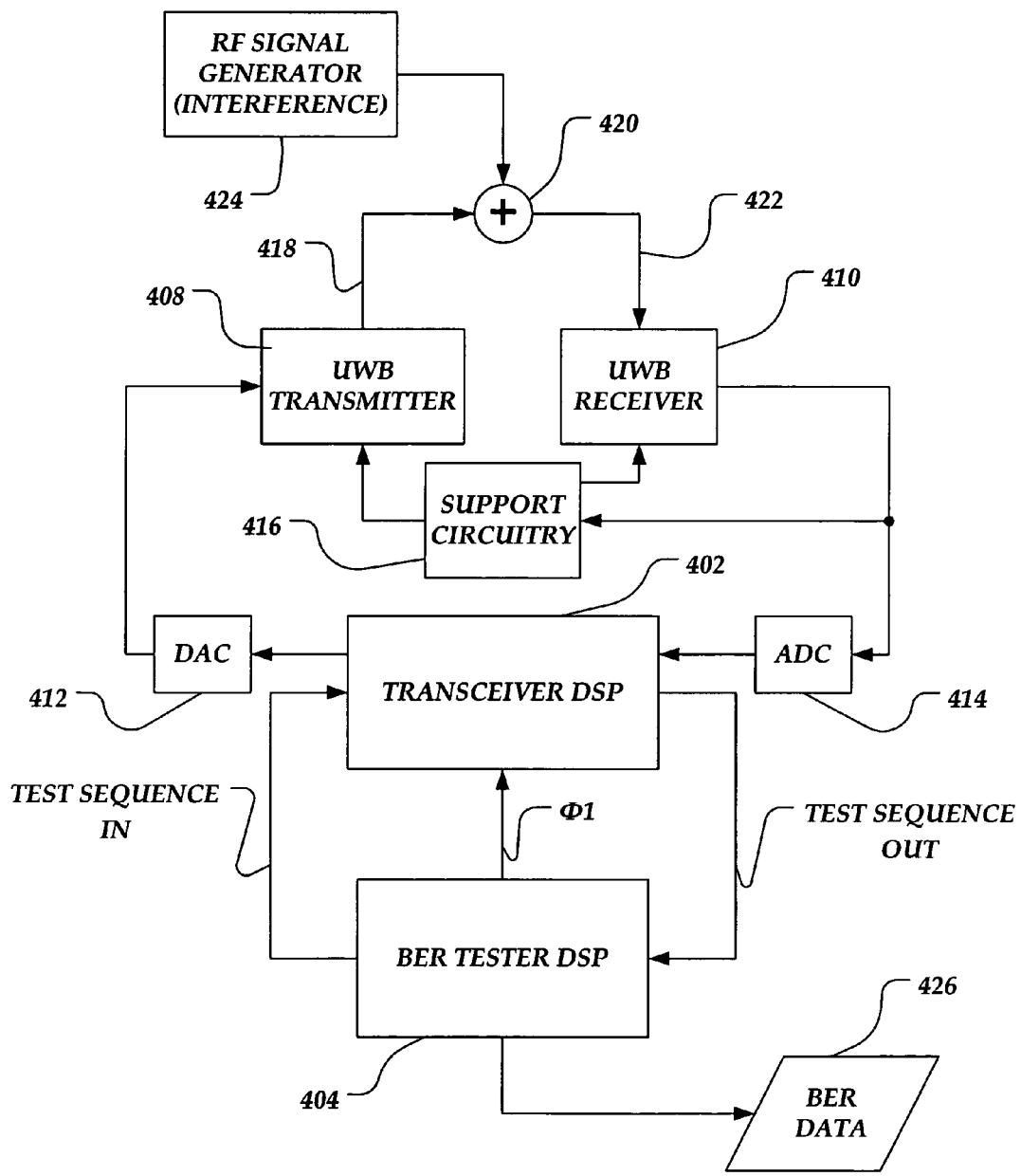
FIG. 4 shows one embodiment of a hardware implementation for a test setup for testing a transceiver for bit error rate in accordance with invention.

FIG. 4 illustrates one embodiment of a system for performing the bit error rate test on a transceiver. The transceiver includes a DSP (digital signal processor) 402, an UWB (ultra-wideband) transmitter 408 and an UWB receiver 410. During transmission, digital to analog converter (DAC) 412 converts the digital PHASER from the transceiver DSP 402 into an analog PHASER for transmission by the UWB transmitter 408. During reception, analog to digital converter (ADC) 414 converts the received analog PHASER back to a digital PHASER for processing by transceiver DSP 402. The transceiver also has support circuitry 416 which includes two base band controllers. The transceiver will be described in more detail hereinafter with a reference to FIG. 5.

In FIG. 4, transceiver DSP 402 is connected to a bit error rate tester 404. The BER tester 404 is also a digital signal processor and includes a number of processing modules. A data generator module (not shown) generates a stream of data bits used as a test sequence of data bits to test the transceiver. The sequence of data bits from the data sequence generator is passed as the "Test Sequence IN" to the transceiver DSP 402. At the transceiver DSP 402, QSPK modulation encodes the bits as discussed above for FIG. 1 into a PHASER in the frequency domain. The transceiver DSP 402 also uses an Inverse Fast Fourier Transform to transform a PHASER from the frequency domain into a PHASER in the time domain. The transformed digital PHASER is converted by DAC (digital to analog converter) 412 to an analog PHASER and passed to UWB (ultra wide band) transmitter 408.

During a test run, the transmitted PHASER from transmitter 408 is sent over a cable 418 to a signal combiner 420 and then over cable 422 to UWB receiver 410. Combiner 420 adds noise to the transmitted PHASER before passing it onto receiver 410. The noise is an RF interference signal generated by generated 424. Transmitted PHASER degraded by the interference signal is received by receiver 410.

The received PHASER is passed to ADC (analog to digital converter) 414. ADC 414 converts the analog PHASER into a digital PHASER and passes it to the transceiver DSP 402. Transceiver DSP uses a Fast Fourier Transform to transform the PHASER from the time domain to the frequency domain. QPSK demodulation in the transceiver DSP 402 decodes the PHASER to recover the data bits of the test sequence. The recovered data bits are passed out from the transceiver DSP 402 as the "Test Sequence OUT" to the BER tester 404. The "Test Sequence OUT" is compared by the BER tester 404 to the data bits in the original "Test Sequence IN" sent to the transceiver DSP. The BER tester notes any errors and computes the bit error rate. The BER tester 404 reports out the bit error rate data 426.

When the test system of FIG. 4 is performing an elevated test 304 (FIG. 3) or a production test 310 (FIG. 3), the phase offset Φ1 is provided by the BER tester 404 to the QPSK modulator and demodulator modules in transceiver DSP 402. When the test system of FIG. 4 is performing a normal test, no phase offset is provided by the BER tester 404 to transceiver DSP 402.

Figure 5:
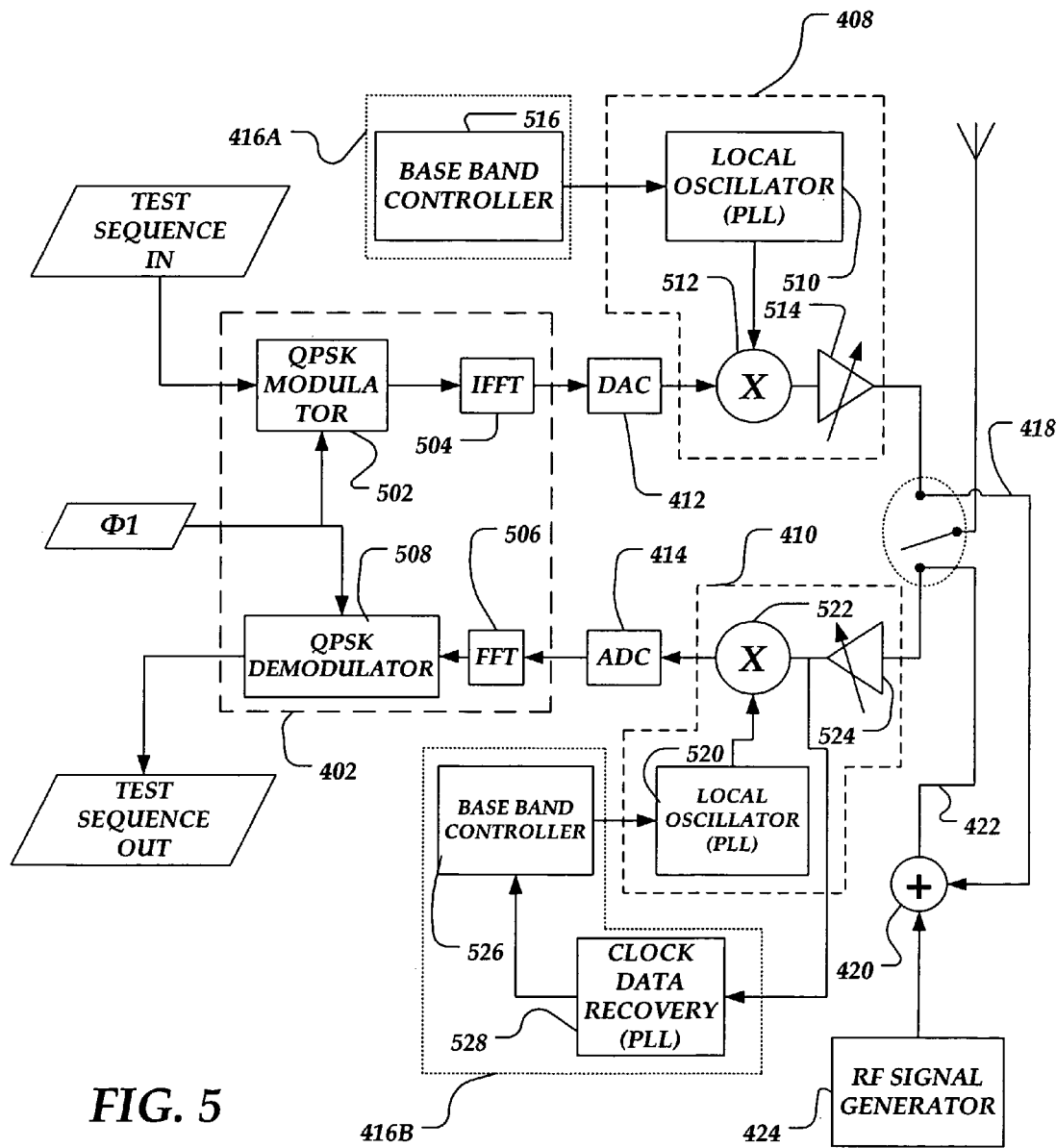
FIG. 5 shows one exemplary embodiment of the transceiver DSP (digital signal processor), the UWB (ultra-wideband) transmitter and UWB receiver of FIG. 4.

In FIG. 5, internal elements of the transceiver components in FIG. 4 are illustrated. The same components in FIGS. 4 and 5 are given the same reference name or numeral except that the support circuitry 416 in FIG. 4 is split into two pieces 416A and 416B in FIG. 5.

Transceiver DSP 402 as shown in FIG. 5 includes the QPSK modulator 502 and the Inverse Fast Fourier Transform module (IFFT) 504 for transmission processing of PHASERs. The Fast Fourier Transform module (FFT) 506 and the QPSK demodulator 508 are used for reception processing of PHASERs. The QPSK modulator 502 encodes the data bit pairs as described in reference to FIG. 1 to create the PHASER in the frequency domain. The QPSK modulator receives the Test Sequence In and the phase offset Φ1 from the BER tester. The IFFT 504 converts the PHASERs from the frequency domain to the time domain for transmission.

During reception processing, the FFT 506 converts the received PHASERs from time domain back to frequency domain and passes the PHASERs now in frequency domain to the QPSK demodulator 508. The QPSK demodulator decodes each PHASER back into a pair of data bits as shown in the QPSK modulation table described in reference to FIG. 1. The QPSK demodulator 508 outputs the Test Sequence Out to the BER tester 404.

The UWB transmitter 408 as shown in FIG. 5 includes a phase locked loop (PLL) acting as a local oscillator (PLL) 510, a mixer 512 and a variable gain amplifier 514. The local oscillator (PLL) 510 provides the high frequency for the mixer 512. The frequency of the multi-bands being used for transmission is selected by the base band controller 516 which is in the support circuitry 416A. The mixer 512 up-converts the PHASERs to the selected frequency band for transmission as a transmission PHASER signal. The variable gain amplifier 514 amplifies the transmission PHASER signal and passes it out onto cable 418. During test the transmit/receive switch 518 is not used because the cable 418 and the cable 422 are electrically connected to the transceiver's transmission output and input.

The UWB receiver 410 as shown in FIG. 5 includes a local oscillator (PLL) 520, a mixer 522 and a variable gain amplifier 524. The variable gain amplifier 524 amplifies the received transmission PHASERs received over cable 422. The local oscillator (PLL) 520 provides the high frequency signal for the mixer 522. The frequency is selected by the base band controller 526 which is in the support circuitry 416B. Clock data recovery module 528 recovers a clock signal based on the received transmission PHASERs signal, this clock signal is used by the base band controller 526 to control local oscillator 520 to operate at the base band frequency of the received transmission PHASERs signal. The mixer 522 down-converts the received transmission PHASERs signal to remove the base band frequency and recover the PHASERs.

Figure 6:
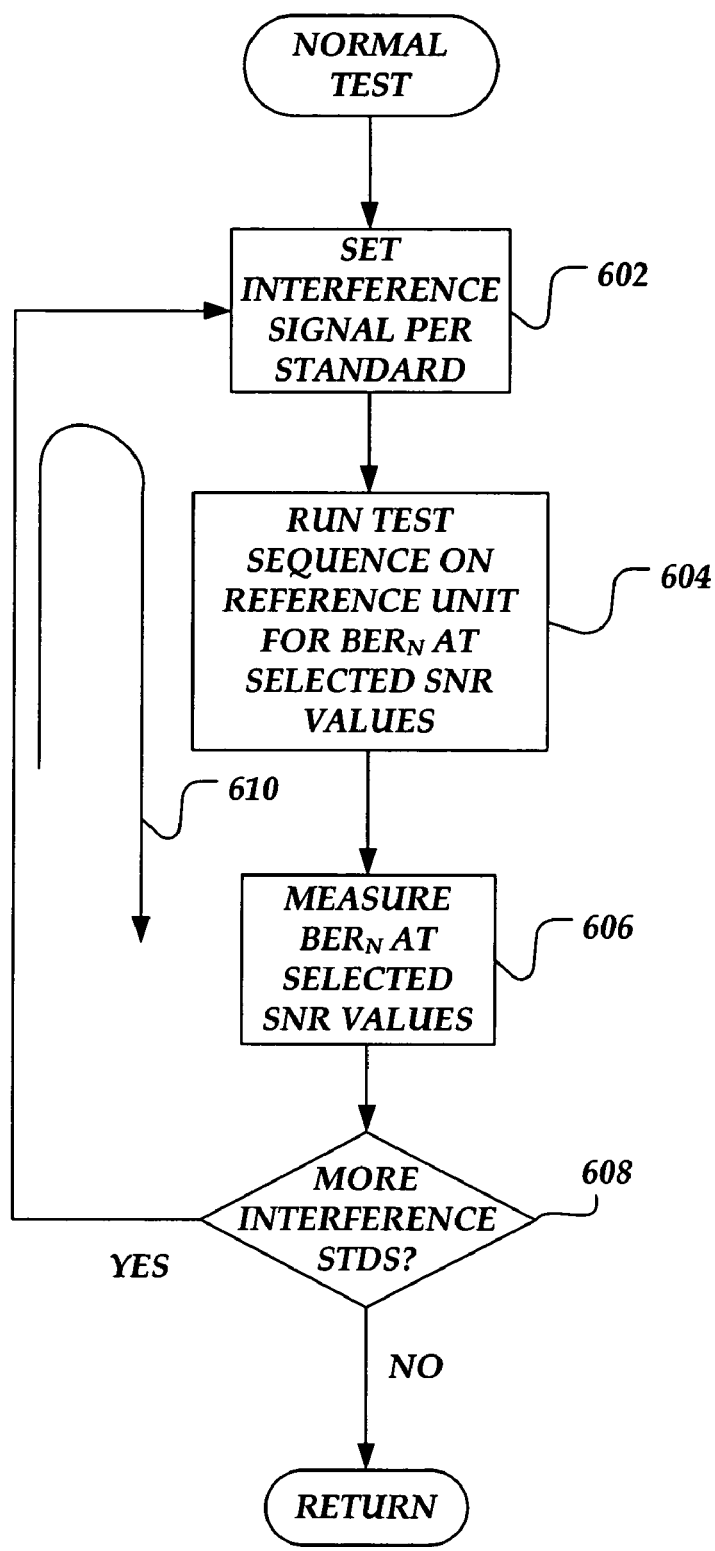
FIG. 6 shows the operational flow for one embodiment of the normal test module 302 of FIG. 3 used to measure $BER_N$ (normal bit error rate) of a transceiver.

FIG. 6 shows the operational flow for one embodiment of the normal test module 302 in FIG. 3. The normal test module runs a test sequence of data bits through the transceiver to gather the data for the $BER_N$ curve in FIG. 2. The operation flow in FIG. 6 begins with set interference operation 602. The bit error rate performance specification for transceivers will require use of a number of interference signal standards to test the robustness (resistance to nose) of the transceiver. Set interference operation 602 sets the interference signal—frequency or frequencies and strength—generated by the RF signal generator 424 (FIG. 4) to an interference standard.

Test run operation 604 runs the test sequence of data bits (Test Sequence In) on a transceiver reference unit, or golden unit, of the same design as the transceiver production units to be tested. The test run is made at selected SNR (signal to noise) values. For examples, a test sequence is run with the interference signal strength set to produce a predetermined SNR value. The test sequence is repeated with the interference signal strength set to produce the next SNR value. Measure $BER_N$ operation 606 measures the bit error rate at each selected SNR value so as to gather data for the $BER_N$ curve in FIG. 2.

More standards test operation 608 detects whether there are more signal interference standards in the BER performance specification for the transceiver. If there are more standards, the operation flow branches YES to return to set interference operation 602. Set operation 602 will set the interference signal in accordance with the next standard. Test run operations 604 and measure operation 606 will run again to create a $BER_N$ curve for this next standard. Operations loop 610 will be performed for each interference standard. When test runs have been made for all interference standards, the operation flow will branch NO from more standards test operation 608 and return to FIG. 3 where the next module is the offset select module 304.

Figure 7:
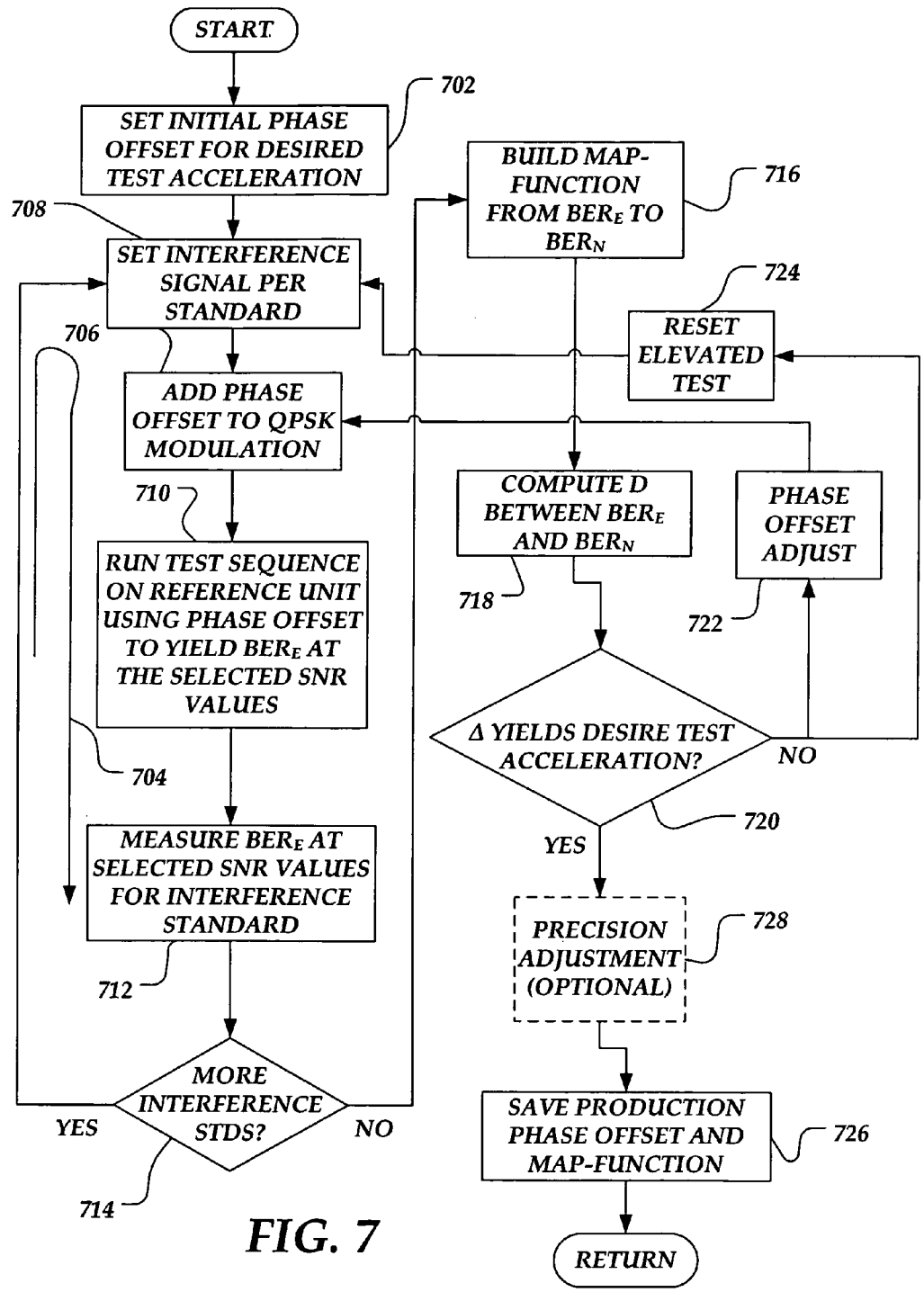
FIG. 7 shows the operational flow for one embodiment of operations performed by the offset select module 304, elevated test module 306 and build map module 308 in FIG. 3.

FIG. 7 shows the operational flow for one embodiment of operations performed by the offset select module 304, elevated test module 306 and build map module 308 in FIG. 3. The operations for selecting the phase offset, running an elevated test and building a map function are interactive with each other as shown in FIG. 7.

In FIG. 7 the operation flow begins with set offset operation 702. Set offset operation 702 sets an initial phase offset to be used in the elevated test run of the transceiver reference unit. This initial phase offset is selected such that it is short of the desired phase offset, i.e. the initial phase offset results in a test acceleration that is less than the desired acceleration. For example, the initial phase offset might be set to produce an initial $BER_E$ curve a fraction of the way between the $BER_N$ curve and the desired $BER_E$ curve.

In FIG. 7 operations loop 704 contains the operations for the elevated test module 306 of FIG. 3. The operations in loop 704 are the same as the operations in operation loop 610 in FIG. 6 with one exception. The exception is the addition of an add offset operation 706 in operations loop 704. Add offset operation 706 adds the phase offset Φ1 adjustment to the QPSK modulation. This is accomplished by changing fractionally the i-axis values and the Q (j-axis) values in the QPSK modulation table.

Set interference operation 706 sets the interference signal—frequency or frequencies and power levels—generated by the RF signal generator 424 (FIG. 4). Test run operation 710 runs the test sequence of data bits (Test Sequence IN) on the transceiver reference unit, but now the PHASERs have been moved by the phase offset Φ1 during QPSK modulation. The test run is made at the same selected SNR (signal to noise ratio) values used during the normal test in FIG. 6. Measure $BER_E$ operation 712 measures the bit error rate at each selected SNR value so as to gather the data for the $BER_E$ curve in FIG. 2.

More standards test operation 714 detects whether there are more signal interference standards in the BER performance specification for the transceiver. If there are more standards, the operation flow branches YES to return to set interference operation 708. Set operation 708 will set the interference signal in accordance with the next standard. Add phase offset 706 applies the phase offset to the QPSK modulation, and test run operations 710 and measure operation 712 will run again the created a $BER_E$ curve for this next standard. Operations loop 704 will be performed for each interference standard. When test runs have been made for all interference standards, the operation flow will branch NO from more standards test operation 714 to build map-function operation 716.

Build map-function 716 will build a map function for each pair of $BER_E$ and $BER_N$ curves for each standard. Elevated error rate Δ computer operation 718 calculates an elevated error rate Δ between the $BER_E$ curve and the $BER_N$ curve. The elevated error rate "Δ" computed might be computed for a predetermined nominal SNR. In another embodiment, a combined "Δ" might be computing by averaging "Δ" over the length of the curves. Other mathematical expressions may be used to arrive at a combined "Δ" over the length of the curves. Acceleration test operation 720 detects whether the elevated error rate Δ and therefore the acceleration factor are great enough to yield the desired BER test acceleration.

If the BER test acceleration is not great enough, the operation flow branches NO from acceleration test operation 720 to phase offset adjust operation 722. Phase offset adjust operation 722 changes the phase offset Φ1 and provides a new phase offset Φ1 to add/subtract phase offset operation 706. Depending on the trend, the phase is added or subtracted to the current phase value in order to reach the desired acceleration in BER measurement. The assumption here is that the acceleration in BER obtained monotonically changes with the phase offset applied in 706 via 722.

In addition to the phase offset adjustment, an elevated test restart is also performed. To do this, the operation flow also branches NO from acceleration test 720 to reset operation 724. Reset operation 724 resets the elevated test operation loop 704 by resetting the set interference operation 708 back to the first interference standard for the elevated test. The operations loop will then repeat until a new $BER_E$ curve using the new phase offset Φ1 has been generated for each interference standard. The build map-function operation 716 and the acceleration test operation 720 are repeated for the new $BER_E$ curves.

When the acceleration test operation 720 detects the desired BER test acceleration has been reached, the operation flow will branch YES to save operation 726. Save operation 726 stores the final phase offset from phase offset adjust operation 722 as a selected phase offset, or production phase offset, for production test of the transceiver units. Save operation 726 also stores the final map function built by build map-function operation 716. After the production phase offset and the map-function are stored by save operation 726, the operation flow returns to production test module 310 in FIG. 3.

Precision adjustment module 728 is optional for micro-adjustment of the map-function or the phase offset Φ1. The reason for a precision adjustment module 728 the operations of such a module are described hereinafter with reference to FIG. 9.

Figure 8:
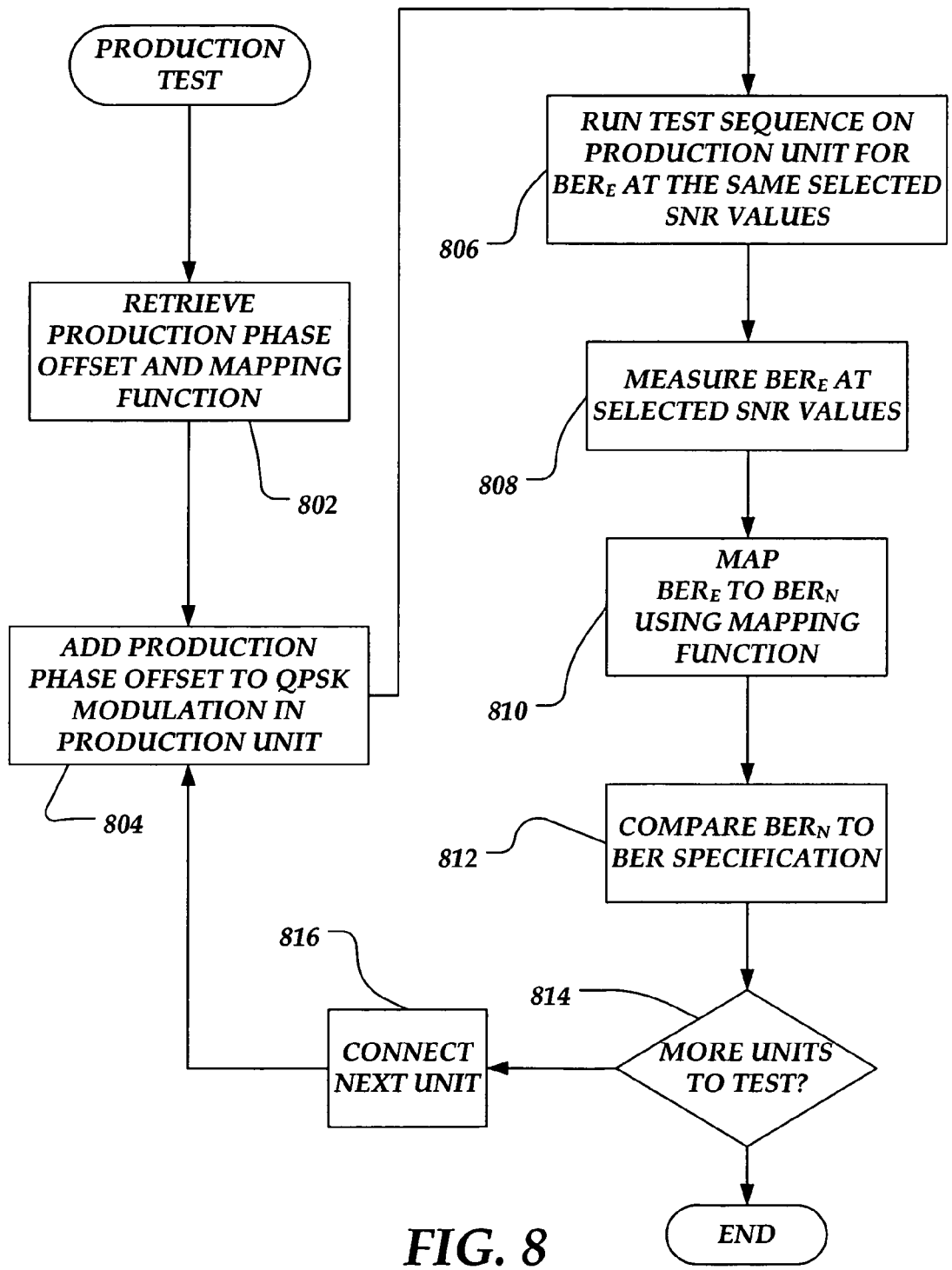
FIG. 8 shows the operational flow for one embodiment of the production test module 310 in FIG. 3.

FIG. 8 shows the operational flow for one embodiment of the production test module 310 in FIG. 3. The operations of the production test module are usually performed as one of the last steps in the manufacturing of the transceiver units. In FIG. 8, the operations of the production test module begin with retrieve operation 802. Retrieve operation 802 retrieves the production phase offset Φ1 and the map function. Add phase offset function 804 adds the phase offset Φ1 to the QPSK modulation in the production transceiver unit under test. This can be done by changing the i-axis and j-axis values in the modulation table used by the QPSK modulator in the production transceiver unit under test.

Test run operation 806 runs an abbreviated test sequence of data bits, as Test Sequence IN, on the transceiver reference unit. The PHASERs have been moved by the phase offset Φ1 during QPSK modulation, as described in reference to the add phase offset function 804. The production test run is performed at the same selected SNR (signal to noise ratio) values used during the normal and elevated test. Measure $BER_E$ operation 808 measures the bit error rate at each selected SNR value so as to gather the data for the $BER_E$ curve.

Transpose operation 810 uses the mapping function, retrieved in operation 802, to map or estimate $BER_N$ values from the $BER_E$ values. This can be done with a look-up table or with a mathematical expression as discussed above.

Compare operation 812 compares the $BER_N$ values to the bit error rate performance specification for the transceiver and passes or fails the production transceiver unit under test.

More units test operation 814 detects whether there are more transceiver production units to be tested. If there are more units to test, the operation flow branches YES to connect next transceiver production unit to the test system. This is likely an automated task during production testing. Once the transceiver unit is connected, the production test on the next transceiver unit begins at add phase offset operation 804. When all production transceiver units have been tested the operation flow branches NO from more units test operation 814 and exits the test program.

Figure 9:
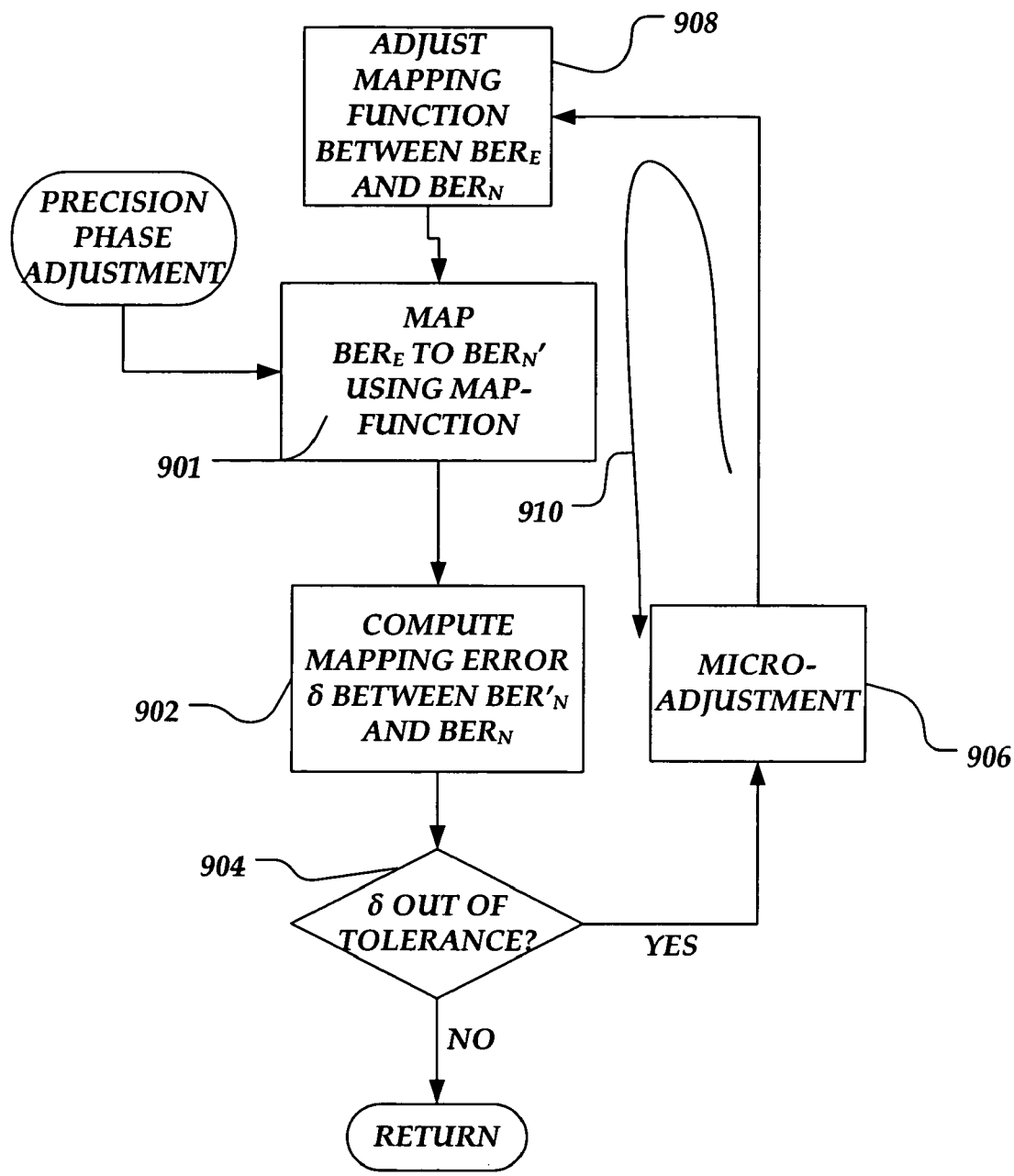
FIG. 9 shows the operational flow for one embodiment implementing the precision adjustment module 728 in FIG. 7.

FIG. 9 shows the operational flow for the precision adjustment module 728 in FIG. 7. The addition of the precision adjustment module 728 in FIG. 7 is another embodiment of the invention. In situations where the map function does not perfectly map values from the $BER_E$ curve to the $BER_N$ curve, the precision adjustment module may be added to FIG. 7. In other words the map function built by build map-function operation 716 (FIG. 7) is used to map values from the measured $BER_E$ value to the mapped/estimated $BER_N'$ value. The mapped $BER_N'$ value may be close to but not equal to the $BER_N$ value. The difference between mapped $BER_N'$ and $BER_N$ may be unacceptable for the purpose of comparing the mapped $BER_N'$ values to the BER performance specification. By adjusting the mapping function precision, order of mapping and the complexity to reduce the mapping error δ between mapped $BER_N'$ and $BER_N$, the mapping error δ may be brought within an acceptable tolerance value. In such a case, the difference between mapped $BER_N'$ values and $BER_N$ values is so small that the mapped $BER_N'$ values are substantially the same as $BER_N$ values for purposes of comparing mapped $BER_N'$ values to the BER performance specification.

In FIG. 9, the operational flow begins at transpose operation 901. Transpose operation 901 uses the mapping function to map the $BER_E$ values to mapped $BER_N'$ values. These mapped $BER_N'$ values do not perfectly match up with the $BER_N$ values. Compute mapping error operation 902 takes the difference δ between mapped $BER_N'$ values and $BER_N$ values for the same signal to noise ratios. This difference is the mapping error δ.

Mapping error test operation 904 detects whether the mapping error δ is out of tolerance. If the mapping error δ is out of tolerance, the operation flow branches YES to micro-adjustment operation 906. Micro-adjustment operation 906 provides the micro-adjustment factor(s) for the mapping function. Adjust map function 908 adjusts the factors (order, precision and complexity) and recomposes the mapping function in accordance with the micro-adjustment factor(s). Compute operation 902 again computes the mapping error δ and mapping error test operation 904 detects whether the mapping error is still out of tolerance. The operations loop 910 continues until the mapping error is within tolerance. The operational flow then branches NO and returns the flow to save operation 726 in FIG. 7.

In another embodiment of the invention, the micro-adjustment operation 906 in FIG. 9 could provide a phase offset adjustment and reset the elevated test as previously described in FIG. 7. In this case the micro-adjustment is a micro phase offset adjustment. $BER_E$ curves are run for all the interference standards in operations loop 704 and the build map-function operation 716 rebuilds the map function to reduce mapping error δ.

Figure 10:
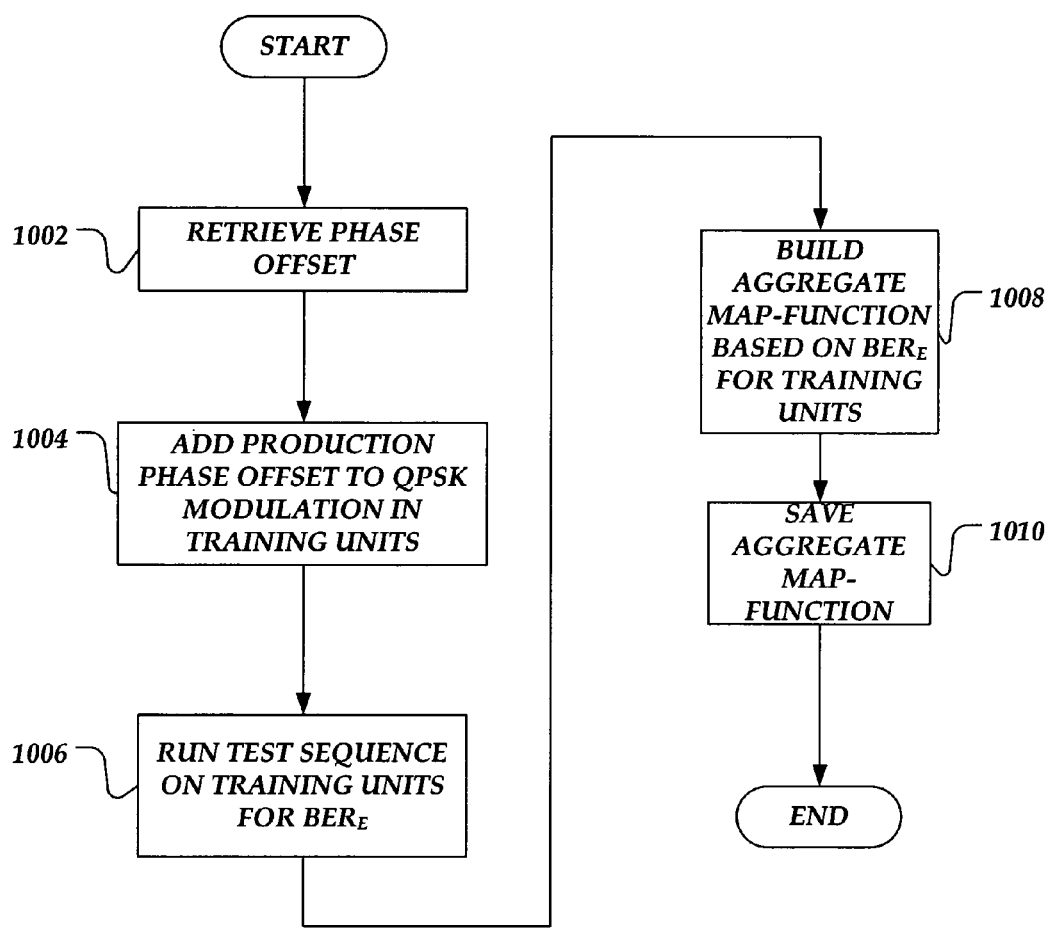
FIG. 10 shows the operational flow for another embodiment of the invention where the map function is trained by running an elevated bit error rate test on a plurality of training units to build an aggregate map function.

In FIG. 10, which is another embodiment of the invention, the map function is trained by running the BER test on a plurality of transceiver training units to build an aggregate map-function. In other words after creating the map function based on a reference unit, or golden unit, the phase offset and mapping function are used to test a number of production transceivers as training units to train the map function. The number of training units is selected based on the desired precision requirement of the mapping function and could be a hundred or several hundred for example.

FIG. 10 shows the operational flow for running the BER test on production transceivers as training units for the map function. The operation flow begins at retrieve operation 1002 which retrieves the phase offset $\Phi 1$ for the $BER_E$ test. Add phase offset operation 1004 adds the phase offset $\Phi 1$ to the QPSK modulation in each of the training units. Run test sequence module 1006 runs the test sequence of data bits on the training units to generate the $BER_E$ curves for each of the training units. Build aggregate map-function operation 1008 can then build a mapping function that represents a composite of all of the $BER_E$ curves for all the training units. In other words an aggregate mapping function is built. The aggregate mapping function maps from an aggregation of all of the $BER_E$ curves for all the training units to the $BER_N$ curve of the reference unit. Save operation 1010 saves the aggregate map-function for use in the production test module 310 in FIG. 3.

As described earlier, FIG. 8 shows the operational flow for production unit test module 310 in FIG. 3. In an embodiment where an aggregate map function from FIG. 10 is used in the production unit test, retrieve operation 802 in FIG. 8 retrieves the aggregate map function. This aggregate map function is used in map operation 810 to map from $BER_E$ values to $BER_N$ values. In all other respects the operation flow in FIG. 8 for an embodiment using an aggregate map function operates in the same way as previously described for FIG. 8.

While the invention has been particularly shown and described with reference to preferred embodiments thereof, it will be understood by those skilled in the art that various other changes in the form and details may be made therein without departing from the spirit and scope of the invention.

What is claimed is:

1. A method for testing bit error rate (BER) performance of transceivers that phase encode digital data when transmitting the digital data, the method comprising:
    running a normal test on a reference transceiver using normal phase encode operations, the normal test collects normal bit error rate ($BER_N$) values;
    selecting a phase offset for use in phase encoding of digital data in the reference transceiver to elevate the bit error rate of the reference transceiver;
    running an elevated test on the reference transceiver using the phase offset in phase encoding of the digital data, the elevated test collects elevated bit error rate ($BER_E$) values;
    building a mapping function to map from $BER_E$ values to $BER_N$ values; and
    running a production test on transceiver production units using the elevated test to accelerate the bit error rate test, and using the map function to map the $BER_E$ values of each production transceiver to $BER_N$ values so that the $BER_N$ values of the production transceiver may be compared to the bit error rate performance specification for the transceiver.

2. The method of claim 1 further comprising:
    testing whether an elevated error rate indicating a higher rate of errors produced by the elevated test yields a desired bit error rate test acceleration; and
    if the elevated error rate does not yield the desired bit error rate test acceleration, adjusting the phase offset to increase the elevated error rate.

3. The method of claim 2 wherein the elevated error rate is the difference between the $BER_E$ values and the $BER_N$ values.

4. The method of claim 2 wherein said act of building a map function further comprises:
    mapping $BER_E$ values to estimated $BER_N'$ values using the map function;
    computing a mapping error between estimated $BER_N'$ values and reference $BER_N$ values;
    testing whether the mapping error is out of tolerance; and
    if the mapping error is out of tolerance, adjusting the map function with a micro-adjustment.

5. The method of claim 1 wherein said act of building a map function further comprises:
    mapping $BER_E$ values to estimated $BER_N'$ values using the map function;
    computing a mapping error between estimated $BER_N'$ values and reference $BER_N$ values;
    testing whether the mapping error is out of tolerance; and
    if the mapping error is out of tolerance, adjusting the phase offset, rerunning the elevated test, and rebuilding the map function.

6. The method of claim 1 wherein said act of building a map function further comprises:
    mapping $BER_E$ values to estimated $BER_N'$ values using the map function;
    computing a mapping error between estimated $BER_N'$ values and reference $BER_N$ values;
    testing whether the mapping error is out of tolerance; and
    if the mapping error is out of tolerance, adjusting the map function with a micro-adjustment.

7. The method of claim 1 wherein the act of building a map function comprises:
    running an elevated test on a plurality of training transceivers and collecting composite $BER_E$ values from testing all of the training transceivers; and
    building an aggregate map function based on the composite $BER_E$ values.

8. The method of claim 7 wherein the map function used by the act of running a production test is the aggregate map function.

9. A system for testing the bit error rate of transceivers that phase encode digital data when transmitting the digital data, the system comprising:
    a normal test module running a full test sequence of digital data on a reference transceiver at selected signal to noise ratios to collect normal bit error rate ($BER_N$) values when using normal phase encode operations in the reference transceiver;
    an offset select module selecting a phase offset for use in elevated phase encoding of digital data in the reference transceiver, the elevated phase encoding with phase offset elevates the bit error rate of the reference transceiver; and
    an elevated test module running an abbreviated test sequence of digital data on the reference transceiver at the selected signal to noise ratios and using the phase offset in an elevated phase encoding of the digital data, the elevated test collects elevated bit error rate ($BER_E$) values when using elevated phase encoding in the reference transceiver whereby the bit error rate test is accelerated.

10. The system of claim 9 further comprising:
a build map module building a map function to map from $BER_E$ values to $BER_N$ values; and
a production test module running a production test with the abbreviated sequence of digital data on a production transceiver using the phase encoding with phase offset to accelerate the bit error rate test, and using the map function to map the $BER_E$ values of the production transceiver to $BER_N$ values so that the $BER_N$ values of the production transceiver may be compared to a reference bit error rate performance specification for the production transceiver.

11. The system of claim 10 wherein the normal test module, the offset select module, the elevated test module, the build map module and production test module all run on a processor in a bit error rate tester.

12. The system of claim 10 wherein the normal test module comprises:
a set interference module setting an interference signal to be applied during testing of the transceiver;
a run test module running the full test sequence on the reference receiver at the selected signal to noise ratios; and
a measure module measuring the $BER_N$ values at the selected signal to noise ratios.

13. The system of claim 12 wherein the elevated test module comprises:
a set interference module setting an interference signal to be applied during testing of the transceiver;
an add phase offset module adding the phase offset into the phase encoding of the digital data;
a run test module running the abbreviated test sequence on the reference receiver at the selected signal to noise ratios; and
a measure module measuring the $BER_E$ values at the selected signal to noise ratios.

14. The system of claim 13 wherein the production test module comprises:
a retrieve module retrieving the phase offset and a map function;
an add phase offset module adding the phase offset into the phase encoding of the digital data in a production transceiver;
a run test module running an abbreviated test sequence on the production receiver at the selected signal to noise ratio values;
a measure module measuring the $BER_E$ values at the selected signal to noise ratios;
a map module mapping the $BER_E$ values to $BER_N$ values; and
a compare module comparing the $BER_N$ values to the bit error rate specification for the production transceiver.

15. A computer-readable medium which stores a set of instructions which when executed performs a method for testing bit error rate performance of transceivers that phase encode digital data when transmitting the digital data, the method executed by the set of instructions comprising:
running a normal test on a reference transceiver with a full test sequence of data to collect normal bit error rate ($BER_N$) values when using normal phase encode operations in the transceiver;
selecting a phase offset for use in phase encoding of data in the reference transceiver to elevate the bit error rate of the reference transceiver;
running an elevated test on the reference transceiver with an abbreviated test sequence of data, the reference transceiver uses the phase offset in phase encoding data during the elevated test, the elevated test collects elevated bit error rate ($BER_E$) values;
building a map function to map from $BER_E$ values to $BER_N$ values; and
running a production test on a production transceiver with an abbreviated test sequence of data, the production transceiver using the phase offset in phase encoding data during the production test to acceleration the bit error rate test, and using the mapping function to estimate the $BER_E$ values of each production transceiver to $BER_N$ values so that the $BER_N$ values of the production transceiver may be compared to the bit error rate performance specification for the transceiver.

16. The computer-readable medium of claim 15 further comprising:
testing whether an elevated error rate indicating a higher rate of errors produced by the elevated test yields a desired bit error rate test acceleration; and
if the elevated error rate does not yield the desired bit error rate test acceleration, adjusting the phase offset to increase the elevated error rate.

17. The computer-readable medium of claim 15 wherein said act of building a map function further comprises:
mapping $BER_E$ values to mapped $BER_N'$ values using the map function;
computing a mapping error between mapped $BER_N'$ values and reference $BER_N$ values;
testing whether the mapping error is out of tolerance; and
if the mapping error is out of tolerance, adjusting the phase offset, rerunning the elevated test, and rebuilding the map function.

18. The computer-readable medium of claim 15 wherein the act of building a map function comprises:
running the elevated test on a plurality of training transceivers and collecting composite $BER_E$ values from testing all of the training transceivers; and
building an aggregate map function based on the composite $BER_E$ values.

19. The computer-readable medium of claim 18 wherein the map function used by the act of running a production test is the aggregate map function.

20. The computer-readable medium of claim 15 wherein the phase encoding is quadrature phase shift keying modulation and wherein the normal test, the elevated test and the production test are all run at same selected signal to noise ratios.

* * * * *